(12) United States Patent
Sonde et al.

(10) Patent No.: US 12,075,701 B2
(45) Date of Patent: Aug. 27, 2024

(54) HGCDTE METASURFACE-BASED TERAHERTZ SOURCE AND DETECTOR

(71) Applicant: Epir, Inc., Bolingbrook, IL (US)

(72) Inventors: Sushant Sonde, Westmont, IL (US);
Yong Chang, Naperville, IL (US);
Silviu Velicu, Willowbrook, IL (US);
Srinivasan Krishnamurthy, Cupertino, CA (US)

(73) Assignee: EPIR, INC., Bolingbrook, IL (US)

( * ) Notice: Subject to any disclaimer, the term of this patent is extended or adjusted under 35 U.S.C. 154(b) by 230 days.

(21) Appl. No.: 17/516,228

(22) Filed: Nov. 1, 2021

(65) Prior Publication Data

US 2022/0231214 A1   Jul. 21, 2022

Related U.S. Application Data

(60) Provisional application No. 63/108,298, filed on Oct. 31, 2020.

(51) Int. Cl.
*H10N 15/10* (2023.01)
(52) U.S. Cl.
CPC .................. *H10N 15/15* (2023.02)
(58) Field of Classification Search
CPC ............ H10N 15/15; H01L 31/02327; H01L 31/02363; H01L 31/02966; H01L 31/08; G01J 5/20
See application file for complete search history.

(56) References Cited

U.S. PATENT DOCUMENTS

| | | | |
|---|---|---|---|
| 5,729,017 A | 3/1998 | Brener et al. |
| 10,732,045 B2 | 8/2020 | Han et al. |
| 10,739,252 B2 | 8/2020 | Zheng et al. |
| 10,753,804 B2 | 8/2020 | Jhon et al. |

OTHER PUBLICATIONS

Yakushev et al., "HgCdTe nanostructures on GaAs and Si substrate for IR and THz radiation detecting", Journal of Physics: Conference Series, vol. 345, 012002, 15 pages. (Year: 2012).*
Vijay K. Narasimhan, Thomas M. Hymel, Ruby A. Lai, and Yi Cui, Hybrid Metal-Semiconductor Nanostructor for Ultahigh Optical Absorption and Low Electrical Resistance at Optoelectronic Interfaces,ACSNANO.ORG, 2015, vol. 9, No. 11, pp. 10590-10597, California, United States.
Nezzih Tolga Yardimci and Mona Jarrahi, Nanostructure-Enhanced Photoconductive Terahertz Emission and Detection, Nano Micro Small, Aug. 29, 2018, 1-14, Small, USA.

(Continued)

*Primary Examiner* — Kiho Kim
(74) *Attorney, Agent, or Firm* — Erickson Law Group, PC.

(57) ABSTRACT

A Terahertz Source and Detector device is provided that includes a nanostructured metasurface configured to transmit fully into a layer of absorbing material below the metasurface to achieve transparent conductivity in the visible spectrum region, wherein the metasurface is composed of crystalline material with very high mobility. The crystalline material can be composed of HgCdTe. The HgCdTe material can have a bandgap of about 700 meV. The intrinsic carrier concentration can be $10^{12}$ cm$^{-3}$ at 300K.

5 Claims, 7 Drawing Sheets

(56) References Cited

OTHER PUBLICATIONS

Thomas Siday, Polina P. Vabishchevich, Lucy Hale, Charles Thomas Harris, Ting Shan Luk, John L. Reno, Igal Brener, and Oleg Mitrofanov, Terahertz Detection with Perfectly-Absorbing Photoconductive Metasurface, Nano Letters, 2019, 2888-2896, NanoLett, New Mexico, USA.

Oleg Mitrofanov, Thomas Siday, Robert J. Thomas et al., Efficient Photoconductive Terahertz Detector With All-Dielectric Optical Metasurface, APL Photonics, Feb. 9, 2018, AIP Publishing, USA.

Nathan M. Burford, Magda O. El-Shenawee, Review of Terahertz Photoconductive Antenna Technology, SPIEDigitalLibrary.org, Jan. 2017, 1-20, vol. 56, Optical Engineering, USA.

\* cited by examiner

HGCDTE METASURFACE-BASED TERAHERTZ SOURCE AND DETECTOR

This application claims the benefit of U.S. Provisional Application 63/108,298, filed Oct. 31, 2020.

STATEMENT REGARDING FEDERALLY SPONSORED RESEARCH OR DEVELOPMENT

This invention was made with government support under contract DE-SC0020603, awarded by the Department of Energy. The government has certain rights in the invention.

BACKGROUND

Terahertz source and detectors are known. U.S. Pat. Nos. 10,732,045; 10,739,252; 10,753,804; and 5,729,017 all disclose terahertz devices and are herein incorporated by reference to the extent that they are not inconsistent with the present disclosure. A conventional terahertz (THz) source and detector device based on photoconductive antenna is shown in FIG. 1. The detector 2 includes a slab 3, an antenna 4 having a gap 5. A bias voltage V is applied with respect to a ground G when operated in source mode. In FIG. 1, "d" is the distance between the antenna edges and "t" is the slab thickness. In detector mode of operation incoming no bias voltage is necessary between the antenna 4 to detect terahertz waves 6, whereas in source mode of operation bias voltage is applied to emit terahertz waves 7.

The device is a simple photoconductive slab with contacts designed to be an antenna for a chosen central frequency. In the case of detection, a DC voltage is applied between the contacts. Owing to large band gap and high resistivity of the PC slab, the dark current is zero. When an ultra-short optic pulse is incident at the center of the antenna as shown, it creates electron-hole (e-h) pairs and the PC slab becomes conducting, thus switching from OFF state to ON state. This leads to a photocurrent at the terminals. Because only finite carriers are created which decay with time, the resulting photocurrent to the antenna is transient, leading to THz radiation when designed properly. In the detector mode, the photoexcited carriers are swept to the terminals by the incident THz signal, leading to detection.

Recently, there has been considerable efforts towards enhancing or localizing the absorption near the terminals using resonant metasurfaces. While these approaches show considerable promise and prove the concept convincingly, the performance is limited by either ohmic absorption in metal-based plasmonic structures or by all-dielectric structures designed to absorb only one polarization—transverse electric (TE) or transverse magnetic (TM) mode—setting the upper limit to the efficiency to 50%. Although the absorption in the dielectric structures is over 80%, the absorption in the region where electron-hole (e-h) pairs can be separated is considerably small or require another dielectric Bragg reflector to increase the path length. With appropriate material and device design, further improvement is possible and that forms the basis of the current invention.

The present inventors have recognized that in a photoconductive antenna based optoelectronic switch (shown in FIG. 1), the device should meet the following three criteria for efficient operation:
(i) The input optical pulse should be fully absorbed in a photoconductive slab for power efficiency.
(ii) All photocarriers must be collected at the metal terminals for improved signal.
(iii) The width of the transient photocurrent must be small for larger radiation bandwidth.

The present inventors have recognized that a thicker slab will ensure full absorption, meeting the first criterion, but many of the electron and hole charge carriers will be generated too far away to make it to the metallic terminals, thus not achieving the second criterion. By applying larger DC bias and selecting high mobility material, the collection can be improved, but the longer time of arrival will limit the success in achieving the third criterion. Further increase in bias will be limited by dielectric breakdown and/or larger dark current which in turn affects the power consumption. To achieve short photocurrent, material can be used with defects for reducing the recombination lifetimes, but the carrier created afar will recombine before contributing to the current, thus affecting the efficiency. Thus, an improvement in achieving one criterion affects the other.

The present inventors have recognized that the limitations of the device designed as shown in FIG. 1 becomes evident when a device tries to achieve simultaneously all three criteria listed above.

SUMMARY

A Terahertz Source and Detector device is provided that includes a nanostructured metasurface configured to transmit fully into a layer of absorbing material below the metasurface to achieve transparent conductivity in the visible spectrum region, wherein the metasurface is composed of crystalline material with very high mobility. The crystalline material can be composed of HgCdTe. The HgCdTe material can have a bandgap of about 700 meV. The intrinsic carrier concentration can be $10^{12}$ cm$^{-3}$ at 300K.

For an input power of 0.1 nW focused to 100 mm$^2$ area and absorbed in 100 nm-thick material the device will produce a photocarrier density of ~$10^{20}$ cm$^{-3}$. The switching contrast in pure sample can be ~$10^8$ at 300K.

An exemplary embodiment Terahertz Source and Detector device of the invention provides a larger photocarrier density for the same input energy, which allows for 1550 nm wavelength for pump probe, for improved efficiency. Pump-probe measurement is a technique for investigating ultrafast phenomenon, where a pump pulse excites a sample generating electron-hole pairs and after an adjustable time delay, a probe pulse hits the sample. By monitoring the probe signal as a function of time delay, it is possible to obtain information on the decay of the generated excitation or on other processes initiated by the pump pulse. In this particular case, the pump pulse is used to generate e-h pairs in the photoconductive slab of material. It is an optical pulse.

The device provides a low-cost THz source and detector. THz sources and detectors based on photoconductive materials are one of the most commonly used for both pulsed and continuous wave operation, with applications ranging from the biomedical field (imaging, burn wound assessment, and dental tissue imaging) to the high-end defense field.

The device can include nanostructured surfaces such as a metasurface being a grid etched out of the non-absorbing layer. The metasurface is designed to transmit fully into a thin layer, such as 100 nm, of absorbing material below the metasurface, which can achieve 97% absorption of both polarizations, to achieve transparent conductivity in the visible spectrum region.

The device can be composed of crystalline material, such as HgCdTe, with very high mobility (~2600 cm$^2$/Vs) in contrast to conventionally used low-temperature grown GaAs ("LT-GaAs") with low mobility (~150 cm$^2$/Vs). The units "Vs" is volt-seconds. The photocurrent for the same input pulse will be a factor 20 times larger than that in LT-GaAs. The transient current duration and shape are determined by the recombination lifetime and that approach is inherently less efficient. In the case of crystalline material, they are determined by the absorption profile, carrier mobility, and bias. With proper design, near 100% efficiency and very broad band THz source should be possible.

The device requires lower input power. For an input optical power of P, the photocarrier is simply, $P/(1.6 \times 10^{-19} (hv))$ where h is Planck's constant and v is frequency and hence the use of longer wavelength of 1550 nm (than the currently used 800 nm) pulse enables about twice the number of photocarrier for the same input energy. Pulse is an optical pulse incident on the sample at the center of the antenna region similar to the one shown in FIG. 1. The THz signal strength is proportional to the photocurrent J which is a product of conductivity and the applied DC electric field. Since the conductivity is proportional to the photocarrier density and the carrier mobility, and that these values are by a factor of 2 and 20 respectively, higher than those with LT-GaAs based work, the power of the input pulse signal can be reduced by a factor 40 for the same signal-to-noise ratio (SNR). Further, applied DC bias can be increased in crystalline materials, owing to larger dielectric breakdown, which increases the THz signal current even higher, enabling us to generate and/or detect THz easily with 100th of the optical pulse power used in current state of the art LT-GaAs based photoconductive devices.

The device obtains a larger bandwidth. While the conventional approach is to use short recombination lifetime to reduce the transient photocurrent width to obtain larger bandwidth, it leads to poor efficiency and low SNR because the carriers whose transit time is longer than the recombination time are lost. For the device, the photocurrent pulse width is determined by the delay of arrival time of the carriers created farther from the current. The device produces and detects THz waves with considerably improved signal-to-noise ratio (SNR). All carriers are created within 100 nm depth profile from the contact and hence the travel distance is mostly determined by the gap between the antenna edges where most carriers are created. Because of large breakdown field, a shorter distance can be maintained between antenna edges which in turn increases the collected carrier density and reduces the pulse duration, leading to broader bandwidth. For the given materials properties, the design parameters are well within the limits to achieve 1 THz bandwidth.

The resistance contrast (also known as switch contrast) is the ratio of the carrier density with and without illumination. For the device, a high quality, crystalline HgCdTe with a bandgap of about 700 meV is used for the absorbing layers. The dark current is determined by the intrinsic carrier concentration which is $10^{12}$ cm$^{-3}$ at 300K. The photocarrier density for an input power of 0.1 nW focused to 100 mm$^2$ area and absorbed in 100 nm-thick material will produce a photocarrier density of $\sim 10^{20}$ cm$^{-3}$. Hence the switching contrast in pure sample is $\sim 10^8$ at 300K even with a nanowatt (nW) power source. Any loss in the collection or illumination over larger area in a real device can be compensated by increasing the source power which is 6 orders of magnitude smaller than the requirement given in this solicitation. To limit the area of carrier collection, in order to control the current pulse width, the HgCdTe can be grown with controlled defects to enable the carriers outside the preferred region to recombine before reaching the antenna. The techniques include selection of lattice mis-matched substrate and compensated doping.

The band gap of HgCdTe alloy can be varied from 0 eV to 1.6 eV by changing the Cd concentration. With appropriate choice of alloys in the pillar and the slab region, the absorption coefficient can be tuned almost arbitrarily to achieve near perfect absorption.

Numerous other advantages and features of the present invention will be become readily apparent from the following detailed description of the invention and the embodiments thereof, and from the accompanying drawings.

BRIEF DESCRIPTION OF THE DRAWINGS

FIG. 3b is a schematic perspective view of a third stage of manufacturing the device of FIG. 2.

DETAILED DESCRIPTION

Figure 1:
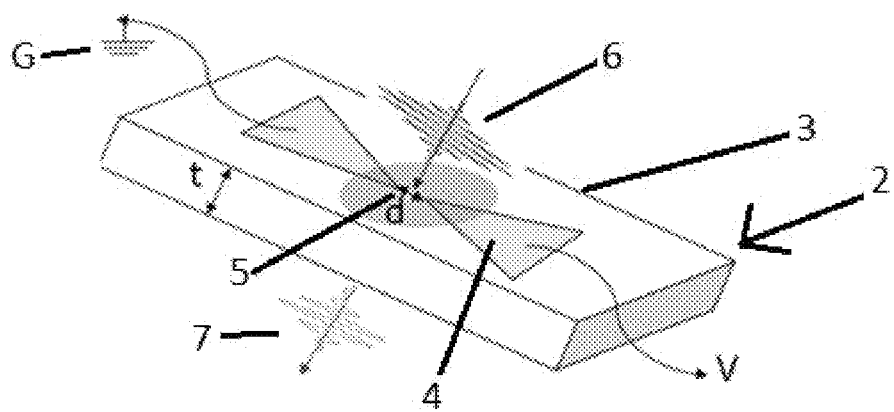
FIG. 1 is a schematic perspective view of a prior art Terahertz (THz) source and detector device.

While this invention is susceptible of embodiment in many different forms, there are shown in the drawings, and will be described herein in detail, specific embodiments thereof with the understanding that the present disclosure is to be considered as an exemplification of the principles of the invention and is not intended to limit the invention to the specific embodiments illustrated.

This application incorporates by reference U.S. Provisional Application 63/108,298, filed Oct. 31, 2020.

An exemplary embodiment Terahertz Source and Detector device includes a large photocarrier density for the same input energy, which allows for 1550 nm wavelength for pump probe, for improved efficiency.

The device provides a low-cost THz source and detector. THz sources and detectors based on photoconductive materials are one of the most commonly used for both pulsed and continuous wave operation. With applications ranging from biomedical field (imaging, burn wound assessment, and dental tissue imaging) to high end defense.

FIGS. 2a-2d illustrate the device 10 which comprises a non-absorbing layer 14, and a metasurface 18 formed by a grid of pillars 19 formed by etching the surface of the non-absorbing layer 14. The device 10 includes an antenna 24 with metal contacts 24a, 24b and a center gap 24c therebetween, and an absorbing layer 30. The absorbing layer 30 is attached by a layer of adhesive or glue 34 to a quartz substrate 38.

Figure 2A:
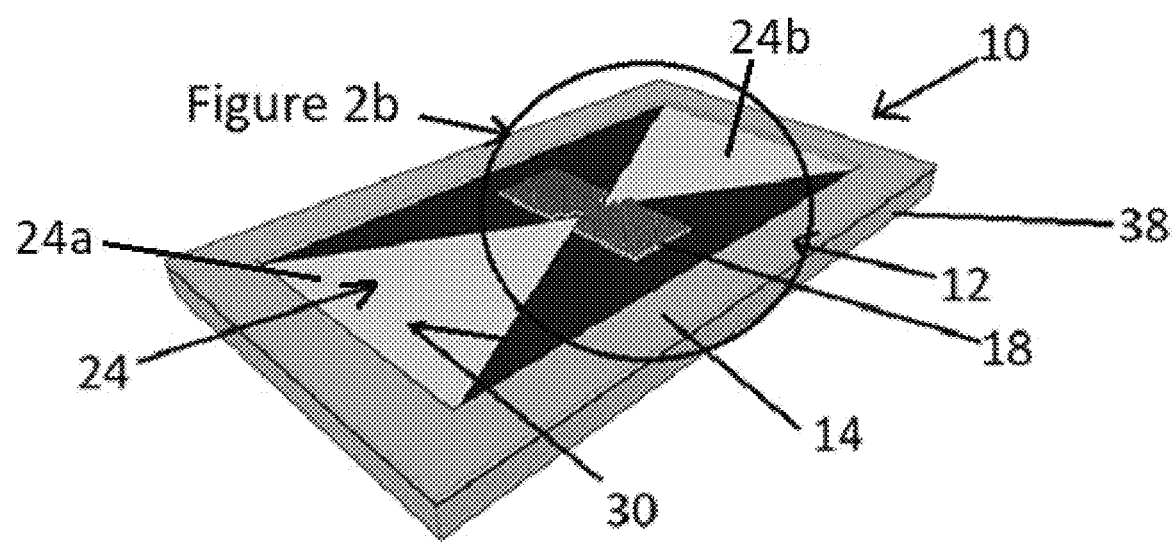
FIG. 2a is a perspective view of a device according to an exemplary embodiment of the invention.
Figure 2B:
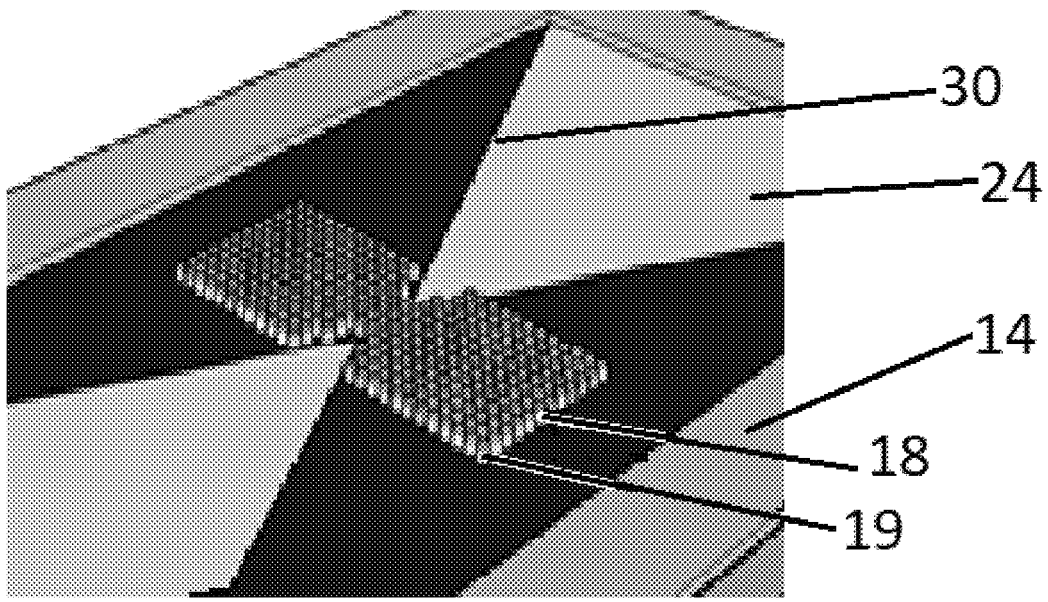
FIG. 2b is a fragmentary, enlarged perspective view of the device shown in FIG. 2.
Figure 2C:
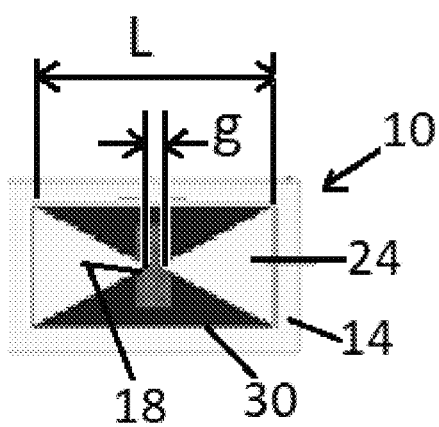
FIG. 2c is a top view of the device of FIG. 2.

FIG. 2c shows a length L of the antenna 24 and the exposed portion of the absorbing layer 30. According to one exemplary embodiment L can be 100 μm. FIG. 2c also shows the center gap 24c of the antenna 24 having a gap length g. The gap length g can be 5 μm.

Figure 2D:
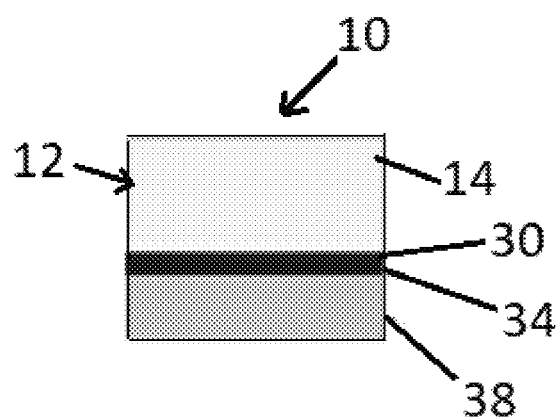
FIG. 2d is a side view of the device of FIG. 2.

FIG. 2d shows the stack arrangement of layers. The non-absorbing layer 14 can have a thickness of 1.1 μm. The absorbing layer 30 can have a thickness of 100 nm. The adhesive layer 34 and a low refractive index substrate such as a quartz layer 38 are shown.

The absorbing layer 30 can be composed of $Hg_{0.7}Cd_{0.3}Te$ having a thickness of 100 nm and the metasurface 18 can be composed of $Hg_{0.28}Cd_{0.72}Te$ having a thickness of 699 nm. This is a calculated composition for THz device operation at 180K.

Alternately, the absorbing layer 30 can be composed of $Hg_{0.44}Cd_{0.56}Te$ having a thickness of 100 nm and the metasurface 18 can be composed of, $Hg_{0.28}Cd_{0.72}Te$ having a thickness of 670 nm. This is a calculated composition for THz device operation at 300K.

Figure 3A:
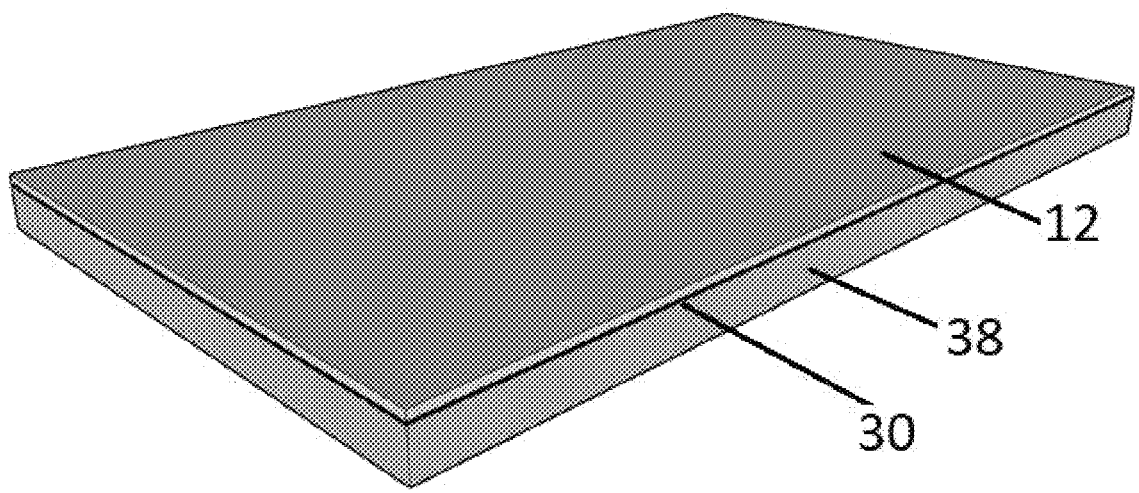
FIG. 3a is a schematic perspective view of a first stage of manufacturing the device of FIG. 2.
Figure 3B:
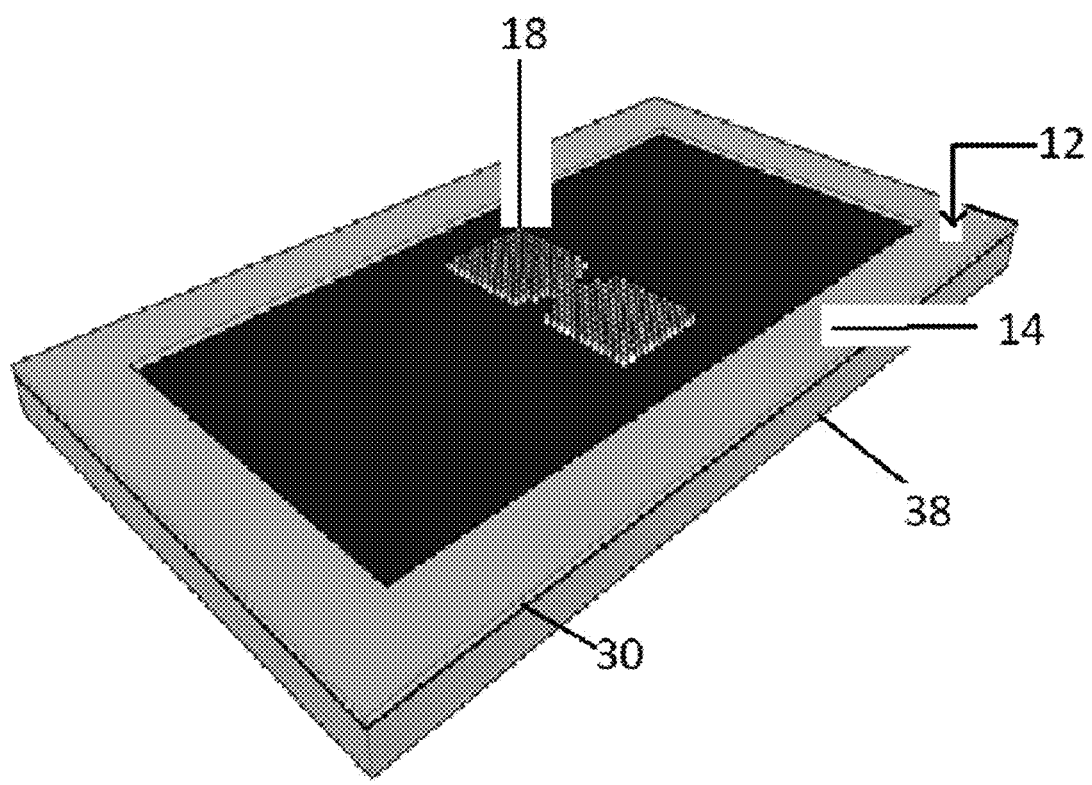
FIG. 3b is a schematic perspective view of a second stage of manufacturing the device of FIG. 2.
Figure 3C:
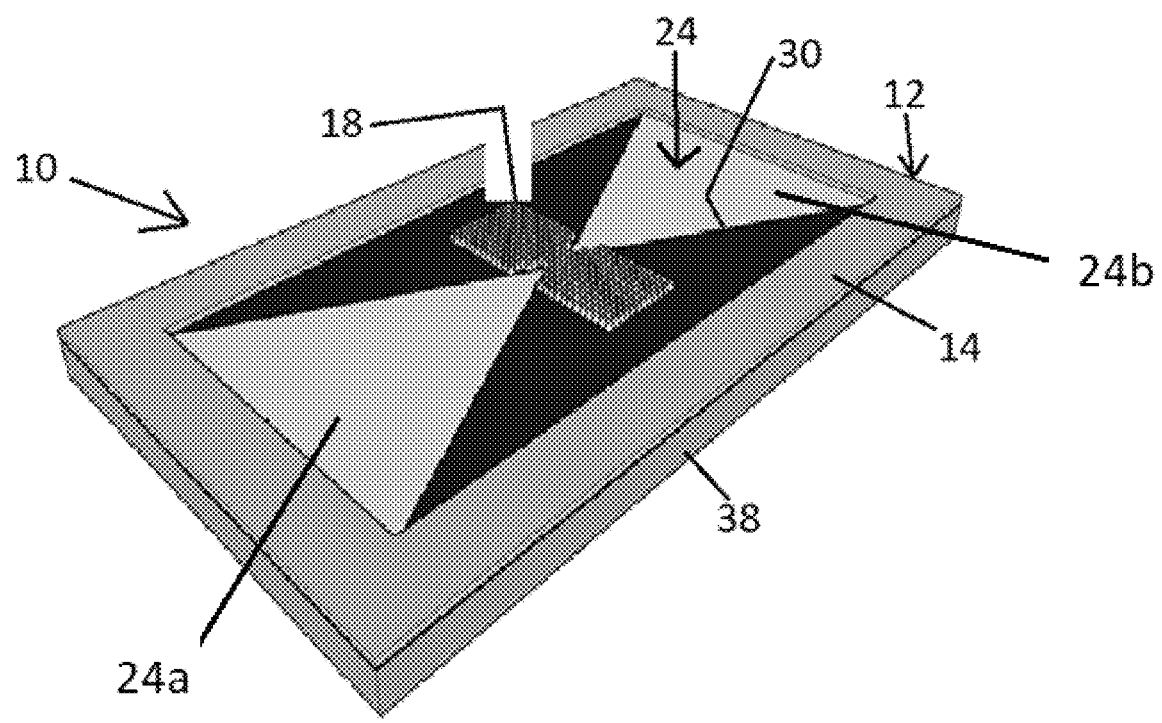
FIG. 3c is a schematic perspective view of a fourth stage of manufacturing the device of FIG. 2.

FIGS. 3a to 3c illustrates three stages of manufacturing the device 10. FIG. 3a illustrates the quartz substrate 38 and the absorbing layer 30 and the non-absorbing layer 14 applied onto the quartz layer. FIG. 3b illustrates the device shown in FIG. 3a in a further stage of manufacturing. The pillars 19 of the metasurface 18 are formed by etching into the non-absorbing layer 14. FIG. 3c illustrates a further stage of manufacturing wherein the antenna 24 and metal contacts 24a, 24b are formed using lithography and metal deposition.

From the foregoing, it will be observed that numerous variations and modifications may be effected without departing from the spirit and scope of the invention. It is to be understood that no limitation with respect to the specific apparatus illustrated herein is intended or should be inferred.

The invention claimed is:

1. A Terahertz Source and Detector, comprising:
   a nanostructured metasurface configured to transmit fully into a layer of absorbing material below the metasurface to achieve transparent conductivity in the visible spectrum region;
   the metasurface composed of crystalline HgCdTe material.

2. The Terahertz Source and Detector according to claim 1, wherein the crystalline material is composed of HgCdTe with a bandgap of about 700 meV.

3. The Terahertz Source and Detector according to claim 1, wherein the intrinsic carrier concentration is $10^{12}$ cm$^{-3}$ at 300K.

4. The Terahertz Source and Detector according to claim 1, wherein photocarrier density for an input power of 0.1 nW focused to 100 mm$^2$ area and absorbed in 100 nm-thick material will produce a photocarrier density of ~$10^{20}$ cm$^{-3}$.

5. The Terahertz Source and Detector according to claim 1, wherein the switching contrast in pure sample is ~$10^8$ at 300K.

* * * * *